United States Patent [19]
Collin et al.

[11] Patent Number: 4,569,064
[45] Date of Patent: Feb. 4, 1986

[54] DEVICE FOR RECOVERY OF CLOCK FREQUENCY IN DIGITAL TRANSMISSION

[75] Inventors: Claude Collin; Joël Faydit; Hervé Pinsard, all of Paris, France

[73] Assignee: Thomson CSF, Paris, France

[21] Appl. No.: 474,977

[22] Filed: Mar. 14, 1983

[30] Foreign Application Priority Data

Mar. 15, 1982 [FR] France ................. 82 04343

[51] Int. Cl.[4] .................................................. H04L 7/04
[52] U.S. Cl. ................................. 375/120; 307/511; 455/260
[58] Field of Search ............... 375/81, 82, 119, 120; 329/50, 122, 124; 328/132, 55; 307/269, 511; 455/260; 231/36 C

[56] References Cited

U.S. PATENT DOCUMENTS

| | | | |
|---|---|---|---|
| 3,047,660 | 7/1962 | Costas | 375/81 |
| 3,569,853 | 3/1971 | Wolejsza, Jr. | 455/260 |
| 3,815,029 | 6/1974 | Wilson | 375/119 |
| 3,934,205 | 1/1976 | Bogert | 375/119 |
| 3,947,772 | 3/1976 | Sato | 331/36 C |
| 3,962,541 | 6/1976 | Seidel | 375/120 |
| 4,000,476 | 12/1976 | Walker et al. | 329/122 |
| 4,380,815 | 4/1983 | Clendening | 375/81 |
| 4,388,730 | 6/1983 | Nash et al. | 375/81 |

FOREIGN PATENT DOCUMENTS

WO80/01630 7/1980 World Int. Prop. O.

OTHER PUBLICATIONS

Bruyland "Optimum Acquisition of the Idling First Order Phase-Lock Loop" pp. 643-647 IEEE Transaction on Aerospace and Electronic Systems.
Turner "Evaluation of Cellular Mobile Telephone Data Receiver" pp. 353-360 IEEE Transaction on Vehicular Tech, Nov., 1980, N.Y.
L. Harms "Wirkungsweise und Anwendung von Phasen-und Frequenzrisen-eine Ubersicht" pp. 296-301, Nachrichtenechnik-Elektronik, vol. 25, No. 8, aout 1975.

*Primary Examiner*—Robert L. Griffin
*Assistant Examiner*—Stephen Chin
*Attorney, Agent, or Firm*—Cushman, Darby & Cushman

[57] ABSTRACT

The device for recovery of the clock frequency of a digital signal comprises a rectifier, a filter having a very narrow bandwidth coupled to the first input of a phase comparator of analog type, a controlled oscillator, the output of which delivers the recovered clock signal and is coupled to the second input of the phase comparator via a low-pass filter. The output of the phase comparator is connected to the input of a loop filter, the output of which is connected to the control input of the oscillator.

5 Claims, 3 Drawing Figures

DEVICE FOR RECOVERY OF CLOCK FREQUENCY IN DIGITAL TRANSMISSION

This invention relates to transmission of digital data in highly disturbed environments and is more particularly directed to a clock frequency recovery device employed in equipments for transmission of digital data between two terminal stations in visibility or not, the communication link being established in the majority of instances by tropospheric or ionospheric propagation.

Communication links of this type suffer attenuation of propagation which is highly variable as a function of time. In order to ensure continuous transmission of information, it is neither economically feasible nor even possible in many cases to adopt the use of equipments having a transmission margin which is sufficient to ensure that the signal can be restituted at the time of maximum attenuation of propagation, such propagation conditions being encountered during a very small percentage of the transmission time. In conventional practice, transmission equipments of this type are provided with a number of transmission channels in parallel having characteristics such as carrier frequencies, for example, which are sufficiently distinct from each other to prevent them from being subjected simultaneously to the same attenuation of propagation. Diversity operation of this type makes it possible to combine the signals derived from the different channels with weighting coefficients which are automatically adjusted in order to obtain at each instant a quality of transmission at least equal to that of the channel which has the best quality at a given instant.

Since the diversity order is limited, there still remain periods of difficult propagation, particularly under conditions of tropospheric or ionospheric scatter. During these periods, which vary between a few milliseconds and a few seconds, the demodulated and combined signal is of very poor quality: the signal-to-noise ratio obtained is very low and may tend towards zero. This demodulated and combined signal is of an analog type and must in fact be regenerated in digital form. For this purpose the signal is directed to two channels:

a clock signal recovery channel, and a regeneration channel in which regeneration is carried out by means of the recovered clock signal.

After regeneration, the transmission equipment restitutes the two signals which it has the function of transmitting, namely the digital signal train containing the information and the clock signal which is in phase with said digital signal train. These two signals are then processed by the digital processing equipment, the clock signal being usually employed for synchronization of the digital processing operation.

Good operation of these processing equipments is dependent on the need to maintain them in synchronism and therefore to maintain the recovered clock signal from which synchronism is obtained.

In the presence of severe fade-out resulting from propagation, it is absolutely necessary in this type of equipment to maintain a recovered clock signal of good quality.

In conventional equipments, however, substantial fading variations give rise to phase jitter in the recovered clock bit signal. This phase jitter makes the signal unusable when it exceeds a given value since the clock frequency recovery devices employed are not optimized for operation with a very low signal-to-noise ratio in view of the fact that the circuits employed often exhibit a threshold effect in the presence of high noise. This threshold effect arises from the fact that the circuits usually employed are logic circuits such as phase comparators in particular. In the presence of noise, a phase comparator delivers an output signal which undergoes abrupt changes of voltage, thus producing disturbances in the controlled frequency. As a general rule, these nonlinear logic circuits do not operate when the signal-to-noise ratio is of the order of a few dB. Furthermore, in the event of interruption of the received signal, conventional devices produce a disappearance of the clock signal.

This invention is directed to a clock frequency recovery device which is not attended by the above-mentioned disadvantages and is such that:

the recovered clock frequency exhibits negligible phase jitter;

the clock bit signal is maintained in the presence of interruptions of the received signal up to several seconds in duration, the resultant phase shift being less than $\frac{1}{4}$ of a bit, in order to ensure that said signal remains usable;

the return to the initial phase at the time of reappearance of the received signal takes place during a time interval which is much shorter than the interruption period.

In accordance with the invention, a device for recovery of the clock frequency in digital transmission essentially comprises an analog rectifying circuit for causing a component to appear in the signal at the clock frequency, the output of said circuit being connected to a filtering circuit having a very narrow bandwidth. The device further comprises a quartz oscillator controlled by a phase-control loop comprising a phase comparator of the analog type, the inputs of which are coupled to the output of the filtering circuit and to the output of the oscillator and the output of which is coupled to the phase control input of the oscillator. Said phase comparator delivers a zero error signal when the signals on its two inputs have a predetermined phase relationship or when the output signal of the filtering circuit is zero.

Other features of the invention will be more apparent upon consideration of the following description and accompanying drawings, wherein.

In conventional designs, signals which have been received and demodulated are combined and the combined signal is transmitted to the input of a clock frequency recovery device comprising a limiter, pulse-shaping circuits and a pulse generator (these circuits are logic circuits) followed by a band filter having a pass-band of the order of $10^{-2}$ of the clock frequency, followed by a logic phase comparator and a conventional phase loop. As mentioned earlier, this type of device does not operate in the case of very low signal-to-noise ratios.

Figure 1:
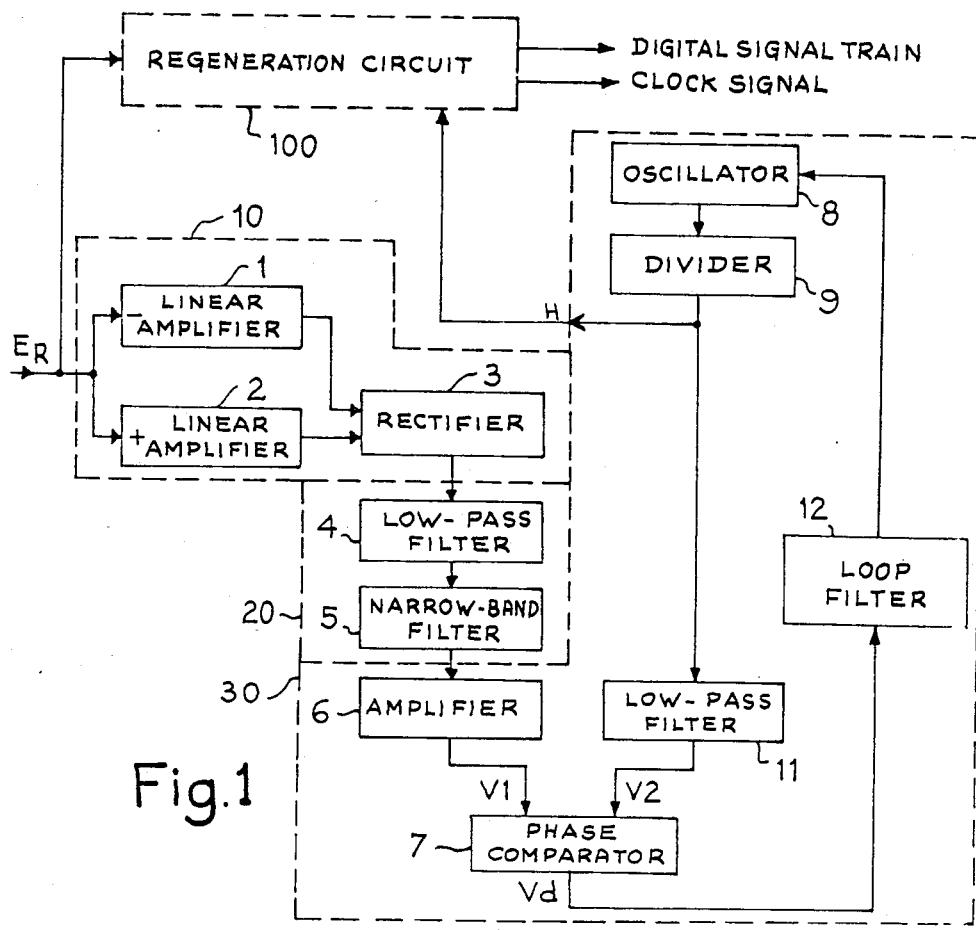
FIG. 1 is a block diagram of the clock frequency recovery device in accordance with the invention.

FIG. 1 illustrates the clock frequency recovery device in accordance with the invention. This device comprises a signal input $E_R$ to which is applied the demodulated and combined signal resulting from the combination of signals received in a plurality of channels in diversity reception. The input aforesaid is connected to the input of a circuit 10 for rectifying the received signal. Said circuit 10 comprises two linear amplifiers 1 and 2 in parallel having inverted outputs connected to the inputs of a full-wave diode rectifier 3.

In this first circuit, the pulses in the form of half-waves derived from the demodulated signal are amplified and then rectified. Energy thus appears at the frequency of the digital rate: for example in the case of a digital rate of 100 kb/s, energy appears at a frequency of f=100 kHz. In contrast to pulse-shaping logic circuits, this circuit does not produce any threshold effect. The output of the rectifier 3 is connected to a filtering circuit 20 comprising a low-pass filter 4, the cutoff frequency of which is slightly higher than the clock frequency. This first filter serves to remove harmonics from the clock frequency. The output of said low-pass filter 4 is connected to the input of a bandpass filter 5 having a very narrow band centered on the clock frequency. Its passband is of the order of $10^{-4}$ with respect to the clock frequency. For example, in the case of a clock frequency of 100 kHz, the passband of the filter 5 is of the order of 10 Hz. This very-narrow-band filtering achieves a substantial improvement in the signal-to-noise ratio at the output. In point of fact, the noise power is integrated in a band of only 10 Hz instead of the noise within the 100 kHz band existing at the input of the device. This filter can consist for example of a quartz crystal utilized in series resonance, tuning being performed by an adjustable series capacitor and the passband being fixed by a series resistor. The output signal of the bandpass filter 5 is therefore a sinewave signal without any appreciable phase jitter at very low signal-to-noise ratios. Furthermore, at the time of interruption of the received signal in the event of severe fade-out, for example, the signal decreases only progressively at the output of the filter by reason of the time constant of said filter associated with its very narrow passband.

The output signal of said filter serves as a reference for an oscillator circuit 30 controlled by a phase-control loop having special properties. Said circuit 30 comprises an amplifier 6, the input of which is connected to the output of the bandpass filter 5, the output of said amplifier being connected to the first input of a phase comparator 7 of the analog type. Said circuit further comprises a VCXO quartz oscillator 8 which is phase-locked to the clock frequency delivered by the bandpass filter 5 by means of a phase loop arranged as follows: the output of the oscillator 8 is connected to the input of a logic-circuit divider 9, the output of which is connected to the input of a low-pass filter 11. The output of said low-pass filter is connected to the second input of the phase comparator 7 of the analog type. The output of said phase comparator is connected to the input of an amplifier with loop filter 12.

The output of the divider 9 delivers to the regeneration circuit 100 a clock signal H at the bit rate and having a predetermined phase relationship with the received signal.

This circuit operates as follows: a logic signal having a frequency F is delivered by the VCXO oscillator 8 from a quartz oscillator which is phase-locked to the output signal of the amplifier 6. If f=F/n is the clock bit rate of the received digital-signal train, the divider 9 is a scale-of-n divider which delivers the recovered clock signal at the bit rate. If the oscillator frequency is the bit rate, then the divider 9 serves no purpose. Said recovered clock bit signal is applied to the input of the low-pass filter 11 which delivers to the second input of the analog phase comparator 7 a sine-wave signal which is compared in phase with the output signal of the amplifier 6.

If $V_1$ is the output voltage of the amplifier 6 and $V_2$ is the output voltage of the low-pass filter 10, the output voltage $V_d$ of the analog phase comparator is of the form: $V_d = kV_1V_2 \cos \phi$, where $\phi$ is the phase difference between the output of the amplifier 6 and the output of the low-pass filter 10, and where k is a constant.

Said error voltage $V_d$ is zero on the one hand when the phase-shift between the signals which are present on these two inputs is equal to $\pi/2$ and on the other hand when the output voltage $V_1$ of the amplifier 6 is zero.

Figure 2:
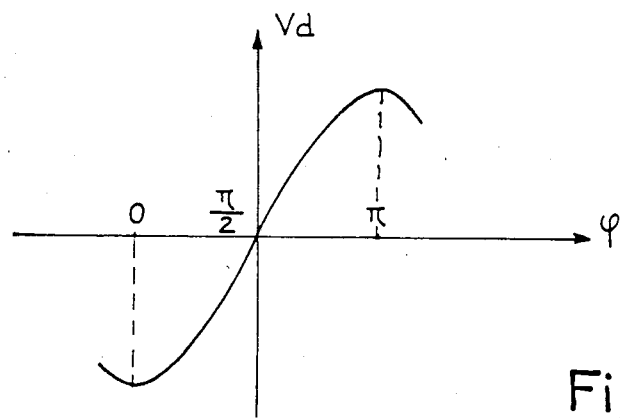
FIG. 2 shows the characteristic curve of the phase comparator employed in said phase loop.

FIG. 2 shows said error voltage $V_d$ as a function of the phase difference $\phi$. The operation of the phase loop is as follows:

In the presence of a received signal, the phase-control loop locks the phase of the oscillator 8 to the phase of the output signal $V_1$ of the amplifier 6, thereby ensuring that the error voltage $V_d$ is zero, this result being obtained when the clock signal is in phase with the reference signal to within $\pi/2$.

At the time of an interruption of transmission, the output signal of the amplifier 6 is constituted by noise which is considerably reduced in comparison with the input noise after passing through the bandpass filter 5 by reason of the fact that its passband is of the order of $10^{-4}$ with respect to the clock rate. The resultant noise voltage $V_1$ which is present at the input of the phase comparator is very close to 0 volt, with the result that the error voltage $V_d$ is also very close to 0 volt. In consequence, at the time of interruption of transmission, there is no voltage jump at the output of the phase comparator since the voltage remains at a practically zero value.

Moreover, in the embodiment described below, the amplifier and the loop filter 12 as well as the oscillator 8 are so designed that the phase of the output signal of said oscillator 8 drifts only at a very slow rate at the time of an interruption of transmission.

Figure 3:
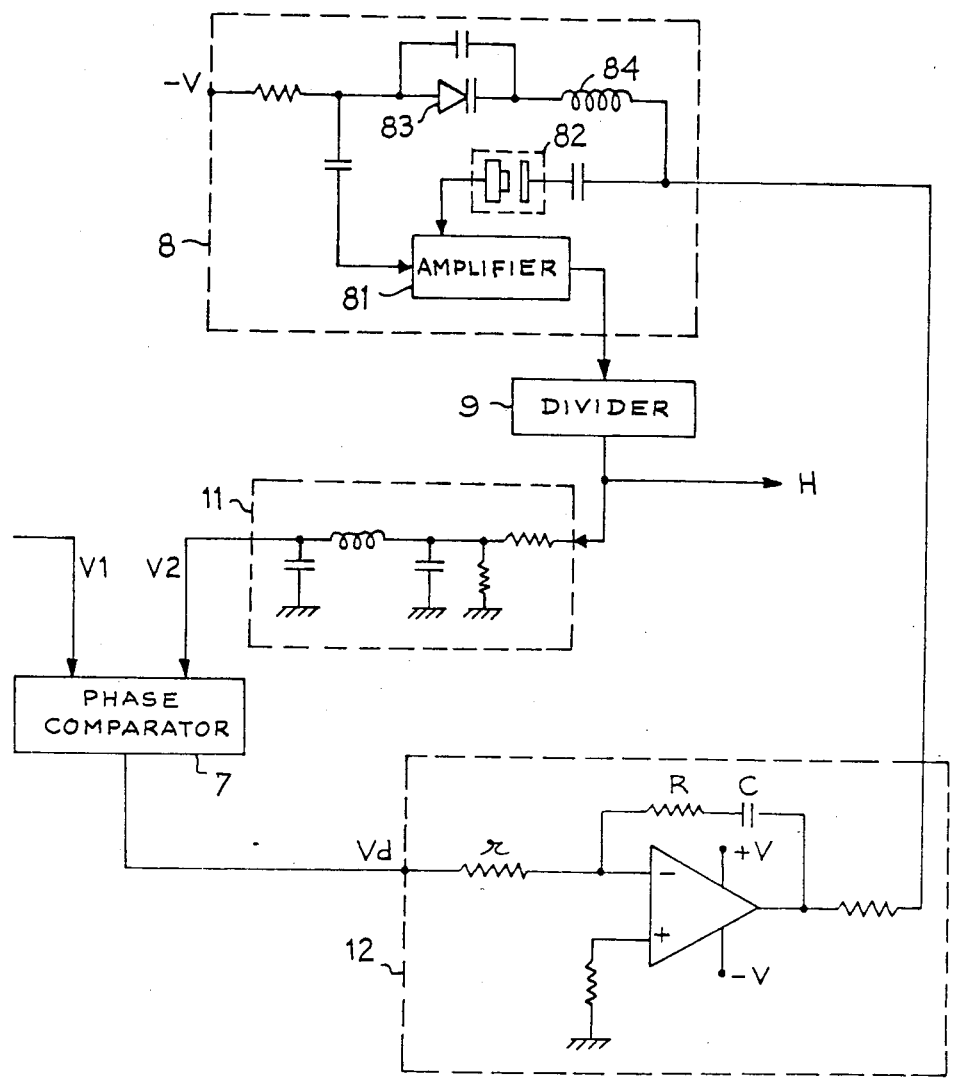
FIG. 3 is a detailed diagram showing one embodiment of the phase loop of the recovery circuit described with reference to FIG. 1.

FIG. 3 shows the details of one embodiment of the phase loop which makes it possible to obtain this result:

The loop filter amplifier 12 is a differential amplifier. The error voltage $V_d$ is applied to the negative input of said amplifier via a resistor r. The output of said amplifier is connected to the same input through a circuit consisting of a resistor R and a capacitor C in series, thus forming the loop filter.

The oscillator 8 comprises an amplifier 81 associated with a quartz crystal unit 82. The oscillator phase control is provided by a varactor 83, that is, a reverse-biased diode having a capacitance which varies with the applied voltage and connected in series with an inductance 84. The voltage applied to the varactor which controls the frequency of the oscillator 8 is the output voltage of the loop filter amplifier 12. At the time of interruption of transmission, the reference signal $V_1$ is practically equal to 0 and phase control no longer produces any action. On the other hand, the capacitor C having a high value of several microfarads discharges through the reverse-biased varactor diode which has a very high value of resistance (several megohms). The time constant of this circuit is very high and the variation in voltage at the output of the differential amplifier remains negligible over a period of a few seconds. In consequence, the frequency of the oscillator also remains stable and only a slight phase drift results. The conventional method of ensuring suitable operation of processing systems which follow a recovery circuit of this type usually consists in producing a phase shift of the clock bit signal of less than one-quarter of a bit over a period of several seconds. This feature can be obtained without difficulty by means of the recovery device in accordance with the invention.

When the signal reappears after an interruption of the transmission, the reference signal $V_1$ is present. The control system comes into action rapidly as a result of the high loop gain (defined by the ratio $R/r$). Since the voltage $V_d$ is very close to 0 volt at the time of interruption, the rise in voltage $V_1$ takes place progressively by virtue of the bandpass filter 5. The result thereby achieved is that the phase of the clock signal H reverts to its nominal value without any discontinuity.

The device in accordance with the invention therefore enables the transmission equipment to restitute the clock signal to the equipment for processing digital data even under poor conditions of propagation.

As already mentioned in the foregoing, said device is applicable to transmission of digital data in highly disturbed environments and therefore above all to zero-visibility links for tropospheric or ionospheric radio communications and also to radio communications from moving vehicles.

What is claimed is:

1. A device for recovery of the clock frequency of a signal in digital transmission, wherein said device comprises an analog rectifying circuit receiving said signal and having an output for causing a component to appear in the signal at the frequency of the clock rate, the output of said rectifying circuit being connected to a filtering circuit of very narrow bandwidth having an output, said filtering circuit including a low pass input filter coupled to a filter having a narrow bandwidth, and a quartz oscillator circuit having a phase control input and an output, said oscillator circuit being controlled by a phase-control loop, said loop comprising a phase comparator of the analog type having two inputs respectively coupled to the output of the filtering circuit and to the output of the oscillator, and having an output coupled to the phase control input of said oscillator, said phase comparator being adapted to deliver a zero error signal when the signals on its two inputs have a predetermined phase relationship or when output signal of the filtering circuit is zero.

2. A device according to claim 1, wherein the oscillator is frequency-controlled by a varactor having a high internal resistance and wherein the phase loop comprises a loop filter with a high-value capacitor which discharges slowly through the varactor at the time of interruptions of transmission, the duration of drift of the recovered clock signal being only a fraction of a period during interruption intervals of the order of one second.

3. A device according to claim 2, wherein said loop has a high loop gain so as to permit a rapid return of the clock signal phase to its nominal value without any discontinuity after an interruption of transmission.

4. A device according to claim 1, wherein the rectifying circuit comprises two linear amplifiers in parallel having inverted outputs, and a full-wave diode rectifier having inputs connected the inverted output of the amplifiers.

5. A device according to claim 1, wherein the filtering circuit comprises said low-pass input filter followed by said filter which is centered on the frequency of the clock rate and has a very narrow band, on the order of $10^{-4}$ with respect to the clock frequency.

* * * * *